(12) United States Patent
Yamazaki et al.

(10) Patent No.: US 9,969,152 B2
(45) Date of Patent: May 15, 2018

(54) METHOD FOR PRODUCING GLASS SUBSTRATE

(71) Applicants: Nippon Electric Glass Co., Ltd., Shiga (JP); Industrial Technology Research Institute, Hsinchu County (TW)

(72) Inventors: Yasuo Yamazaki, Shiga (JP); Takahide Fujii, Shiga (JP); Chun-Hsien Chien, New Taipei (TW); Chia-Sheng Huang, Yilan County (TW); Ting-Yu Ke, Changhua County (TW); Hsin-Yun Hsu, Hsinchu County (TW)

(73) Assignees: Nippon Electric Glass Co., Ltd., Shiga (JP); Industrial Technology Research Institute, Hsinchu County (TW)

( * ) Notice: Subject to any disclaimer, the term of this patent is extended or adjusted under 35 U.S.C. 154(b) by 125 days.

(21) Appl. No.: 15/071,208

(22) Filed: Mar. 16, 2016

(65) Prior Publication Data

US 2016/0276631 A1    Sep. 22, 2016

(30) Foreign Application Priority Data

Mar. 16, 2015    (JP) .................................. 2015-052318

(51) Int. Cl.
  *B32B 7/06*    (2006.01)
  *B32B 17/06*   (2006.01)
  (Continued)

(52) U.S. Cl.
  CPC .............. *B32B 43/006* (2013.01); *B32B 7/06* (2013.01); *B32B 17/06* (2013.01); *B32B 37/06* (2013.01); *H01L 51/003* (2013.01); *H01L 51/0096* (2013.01); *B32B 2309/02* (2013.01); *B32B 2309/10* (2013.01); *B32B 2309/105* (2013.01); *B32B 2315/08* (2013.01); *B32B 2457/20* (2013.01); *B32B 2457/206* (2013.01);
  (Continued)

(58) Field of Classification Search
  USPC ........................ 156/247, 306.3, 308.2, 309.9
  See application file for complete search history.

(56) References Cited

U.S. PATENT DOCUMENTS

2014/0216641 A1 *   8/2014   Canfield ................. B32B 37/06
                                                          156/272.2

FOREIGN PATENT DOCUMENTS

DE    2829371 A1 *   1/1980    ............. C03C 17/00
JP    2012-30404        2/2012

OTHER PUBLICATIONS

Machine translation of JP 2012-030404 (Year: 2017).*
English Abstract of DE 2829371 (Year: 2017).*

* cited by examiner

Primary Examiner — Sing P Chan
(74) Attorney, Agent, or Firm — JCIPRNET

(57) ABSTRACT

In a method of producing a glass substrate including a laminate preparing step of laminating a glass film 1 having flexibility and a support glass 2 supporting the same, to prepare a laminate 3; a process step of forming an organic EL device 4 on the glass film 1 in the laminate 3, involving heating; and a peeling step of peeling off the glass film 1 on which the organic EL device 4 is formed from the support glass 2 to obtain a glass substrate 5, a heating step of heating the glass film 1 and the support glass 2 is executed before execution of the laminate preparing step, and the glass film 1 and the support glass 2 are laminated in the condition that they are heated at the time of execution of the laminate preparing step.

3 Claims, 3 Drawing Sheets

(51) Int. Cl.
  *B32B 37/06* (2006.01)
  *H01L 51/00* (2006.01)
  *H01L 51/52* (2006.01)
  *B32B 43/00* (2006.01)
(52) U.S. Cl.
  CPC ...... *H01L 51/0097* (2013.01); *H01L 51/5246* (2013.01); *H01L 2227/326* (2013.01); *H01L 2251/5338* (2013.01); *Y02E 10/549* (2013.01)

METHOD FOR PRODUCING GLASS SUBSTRATE

CROSS-REFERENCE TO RELATED APPLICATION

This application claims the priority benefit of Japan application no. 2015-052318, filed on Mar. 16, 2015. The entirety of the above-mentioned patent application is hereby incorporated by reference herein and made a part of this specification.

TECHNICAL FIELD

The present invention relates to a method for producing a glass substrate that produces a glass substrate by forming an electronic device member such as a liquid crystal device or an organic EL device on a glass film.

BACKGROUND ART

In mobile devices such as smartphones and tablet PCs that have rapidly spread in recent years, weight reduction is demanded, and reduction in thickness of a glass substrate that is incorporated into such a product has been advanced today. For responding to such demand, a glass film that is obtained by thinning a plate glass into a film (for example, thickness of not more than 300 μm) has been developed. This glass film has the property of excellent flexibility because of its very small thickness.

In producing a glass substrate by subjecting the glass film to a process of forming an electronic device member such as a liquid crystal device or an organic EL device, a laminate obtained by laminating the glass film and a support glass for supporting the glass film (see Patent Document 1) is sometimes used for facilitating the handling of the glass film during the process. By utilizing this laminate, it is possible to temporarily exclude the property of excellent flexibility of the glass film laminated with the support glass. Further, since adhesion force acts between the laminated glasses, the glass film under process is advantageously less likely to be peeled off from the support glass.

PRIOR ART DOCUMENT

Patent Document

[Patent Document 1] JP 2012-30404 A

SUMMARY OF THE INVENTION

Problems to be Solved by the Invention

Although a laminate has such excellent functions as described above, the following problem can arise when the glass film is peeled off from the support glass for incorporating the glass film having experienced the process (the glass film on which an electronic device member is formed) as a glass substrate into a product. To be more specific, when the glass film is subjected to a process involving heating such that the laminate is put in a high temperature atmosphere, the adhesive force acting between the glass film and the support glass during the process excessively increases. This leads into the problem that the glass film after the process is difficult to be peeled off from the support glass.

The present invention devised in light of the above circumstances to prevent the glass film from peeling from the support glass during a process of forming an electronic device member, and to allow the glass film to be peeled from the support glass after the process.

Means for Solving the Problems

A method of producing a glass substrate according to the present invention that is devised to solve the above problem includes: a laminate preparing step of laminating a glass film having flexibility and a support glass that supports the glass film to prepare a laminate; a process step of foaming an electronic device member on the glass film in the laminate, involving heating; and a peeling step of peeling off the glass film on which the electronic device member is formed from the support glass to obtain a glass substrate, and is characterized in that before execution of the laminate preparing step, a heating step of heating the glass film and the support glass is executed, and at the time of execution of the laminate preparing step, the glass film and the support glass are laminated in the condition that they are heated.

According to such a method, it is possible to prevent the glass film from peeling from the support glass during execution of the process step, while allowing the glass film on which the electronic device member is formed to be peeled off from the support glass during execution of the peeling step after execution of the process step.

Assumable reasons for obtaining the aforementioned effects are as follows. As the glass film and the support glass are laminated by the execution of the laminate preparing step, adhesive force acts between these glasses. During execution of the later process step, the magnitude of the adhesive force acting between the glasses increases from the magnitude directly after execution of the laminate preparing step (hereinafter, referred to as an initial value). The increase in adhesive force from the initial value is ascribable to the fact that the heating involved in formation of the electronic device member on the glass film causes dehydration condensation of hydroxyl groups and moisture residing on the respective mating faces of these glasses. Here, in the method of producing a glass substrate as described above, the heating step of heating the glass film and the support glass is executed before execution of the laminate preparing step. By execution of this heating step, hydroxyl groups and moisture residing on the respective mating faces of these glasses are partly removed. That is, hydroxyl groups and moisture that cause dehydration condensation partly disappear. As a result, the increase from the initial value of the adhesive force during execution of the later process step is suppressed for the removed part of the hydroxyl groups and moisture. In the aforementioned method of producing a glass substrate, the glass film and the support glass are laminated in the condition that they are heated at the time of execution of the laminate preparing step. The higher the temperature at which these glasses are laminated, the larger the initial value of the adhesive force acting between these glasses. Therefore, by laminating the glasses in the condition that they are heated, the initial value of the adhesive force increases for this heating.

Based on the foregoing, it is inferred that in the above method of producing a glass substrate, by the heating step before execution of the laminate preparing step, the increase in adhesive force from the initial value during execution of the process step is suppressed to such an extent that the glass film can be peeled off from the support glass at the time of execution of the peeling step. Further, it is inferred that the initial value of the adhesive force is large enough to prevent the glass film from peeling from the support glass during execution of the process step because the glasses are heated at the time of execution of the laminate preparing step.

In the above method, it is preferred that the glass film and the support glass are heated to a temperature of 100° C. or higher in the heating step.

In this manner, the glass film on which the electronic device member is formed is more easily peeled off from the support glass at the time of execution of the peeling step.

In the above method, it is preferred that the temperatures of the glass film and the support glass in laminating the glass film and the support glass in the laminate preparing step are 100° C. or higher.

In this manner, it becomes easier to prevent the glass film from peeling from the support glass during execution of the process step.

Effects of the Invention

According to the present invention, it is possible to prevent the glass film from peeling from the support glass during the process of forming the electronic device member, while allowing the glass film to be peeled off from the support glass after the process.

EMBODIMENTS OF THE INVENTION

Hereinafter, a method of producing a glass substrate according to an embodiment of the present invention will be described with reference to attached drawings.

Figure 1:
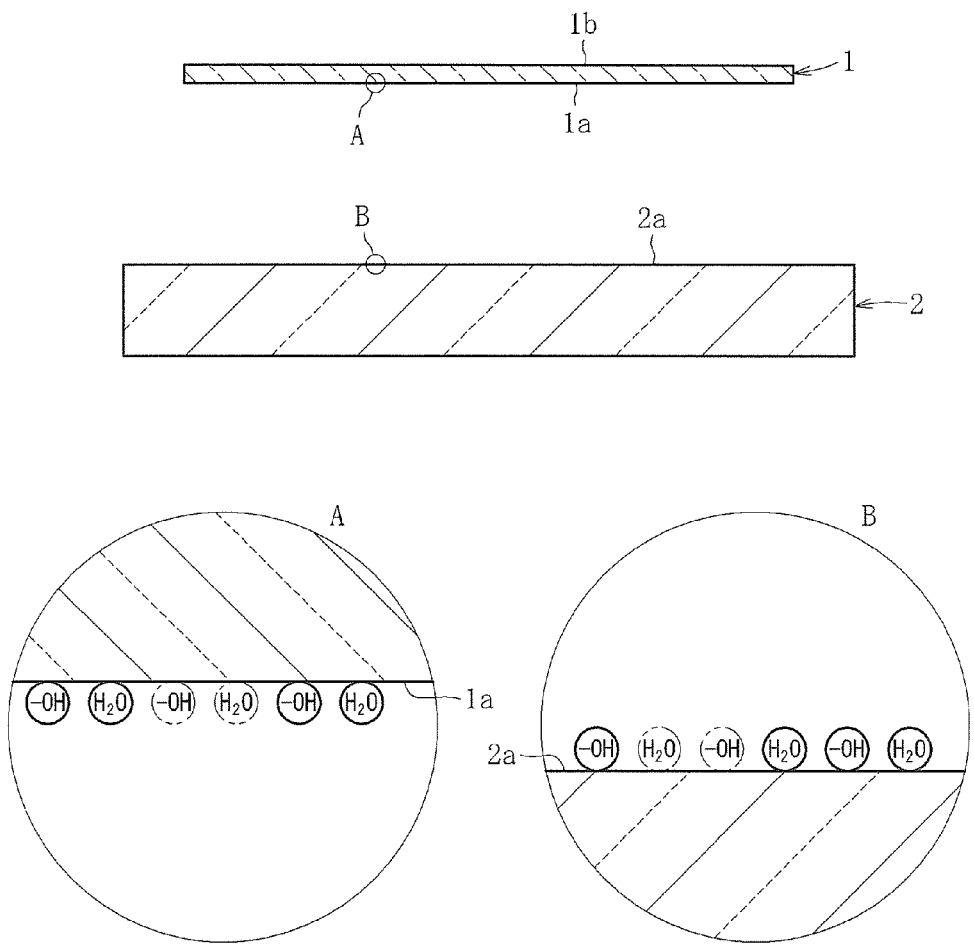
FIG. 1 is a section view showing a heating step in the method of producing a glass substrate according to an embodiment of the present invention.
Figure 2:
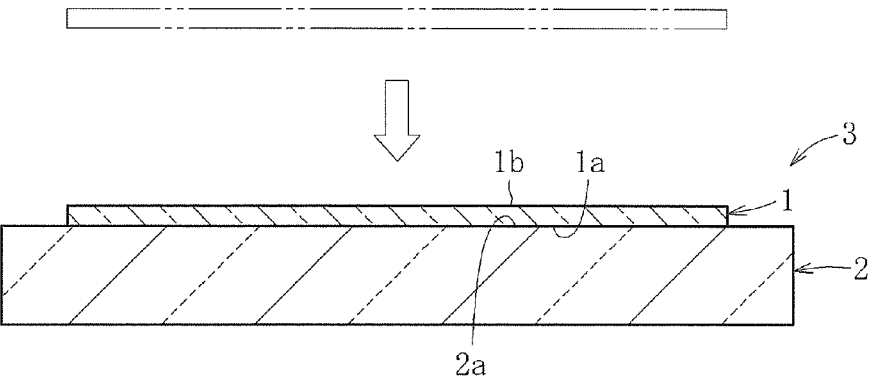
FIG. 2 is a section view showing a laminate preparing step in the method of producing a glass substrate according to an embodiment of the present invention.
Figure 3:
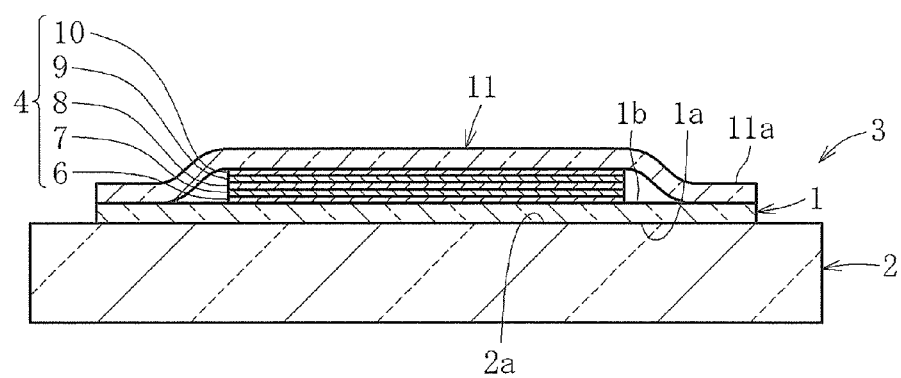
FIG. 3 is a section view showing a process step in the method of producing a glass substrate according to an embodiment of the present invention.
Figure 4:
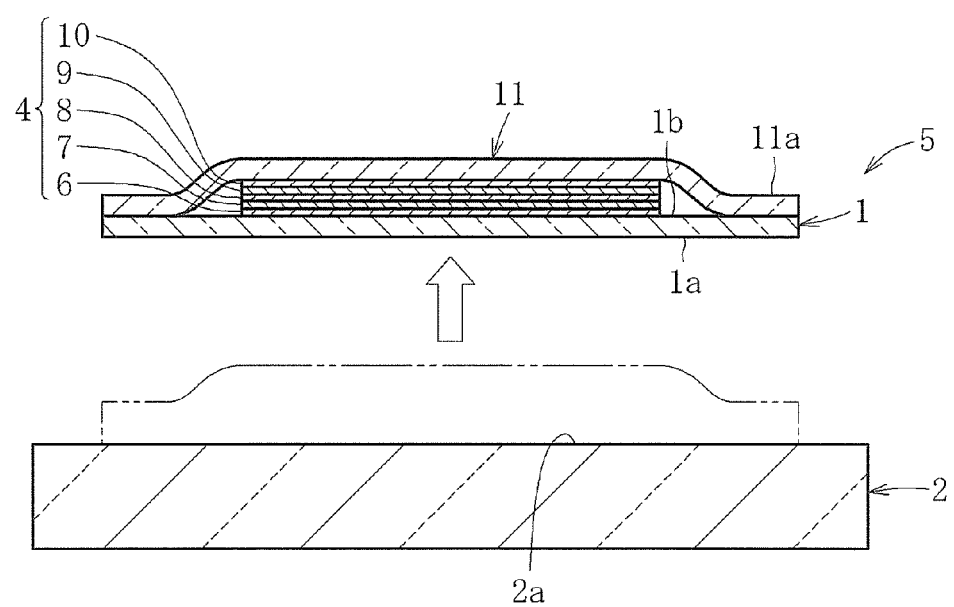
FIG. 4 is a section view showing a peeling step in the method of producing a glass substrate according to an embodiment of the present invention.

As illustrated in FIG. 1 to FIG. 4, the method of producing a glass substrate according to the embodiment of the present invention includes: a heating step of heating a glass film 1 having flexibility, and a support glass 2 for supporting the glass film 1 (FIG. 1); a laminate preparing step of preparing a laminate 3 by laminating the glasses 1, 2 in the condition that they are heated (FIG. 2); a process step of foil ling an organic EL device 4 as an electronic device member on the glass film 1 in the laminate 3, involving heating (FIG. 3); and a peeling step of peeling off the glass film 1 on which the organic EL device 4 is formed, from the support glass 2 to obtain a glass substrate 5 (FIG. 4).

In this method of producing a glass substrate, glass having various compositions can be used as the glass film 1 and the support glass 2, and in the present embodiment, alkalifree glass is used as the glasses 1, 2. Also in the case where glass other than alkalifree glass is used, it is preferred to use the glass film 1 and the support glass 2 having the same composition. In this way, it is possible to prevent the glass film 1 from being broken during execution of the process step due to the difference in magnitude of the coefficient of thermal expansion between the glasses 1, 2.

As the glass film 1 and the support glass 2, glass that is molded in various molding methods can be used, and in the present embodiment, glass molded by an overflow down drawing method is used. The thickness of the glass film 1 is, for example, 100 On the other hand, the thickness of the support glass 2 is larger than the thickness of the glass film 1, and is, for example, 500 μm.

The value of surface roughness Ra in a mating face 1a of the glass film 1 (the surface on the side where it is brought into contact with the support glass 2), and in a mating face 2a of the support glass 2 (the surface on the side where it is brought into contact with the glass film 1) is not more than 2.0 nm. The value of Ra is preferably not more than 1.0 nm, more preferably not more than 0.5 nm, most preferably not more than 0.2 nm. The smaller the value of Ra, the more strongly the laminated glass film 1 and the support glass 2 can be adhered.

In the heating step, the glass film 1 and the support glass 2 are not laminated, and the glasses 1, 2 are individually heated to a temperature of 100° C. or higher from a temperature under normal temperature. For heating the glasses 1, 2, for example, a hot plate, a flash lamp or the like can be used. In the heating step, the glasses 1, 2 are heated to preferably 150° C. or higher, more preferably 200° C. or higher, most preferably 300° C. or higher. The temperature which is to be the upper limit of heating is the temperature that is a strain point for each of the glasses 1, 2 used herein. By heating to higher temperature, the glass film 1 on which the organic EL device 4 is formed can be peeled off from the support glass 2 more easily at the time of executing the peeling step. The glasses 1, 2 may be heated so that they are at the same temperature, or may be heated so that they are at different temperatures. The heating time for each of the glasses 1, 2 is preferably 5 min to 60 min, more preferably 10 min to 30 min. The heating time may be the same or different between the glasses 1, 2.

By executing this heating step, as illustrated in the enlarged view of the mating face 1a of the glass film 1, and the mating face 2a of the support glass 2 (A part and B part in FIG. 1), hydroxyl groups and moisture that cause dehydration condensation during execution of the later process step are partly removed from each of the mating faces 1a, 2a. As a result, increase in adhesive force from the initial value (magnitude of adhesive force directly after execution of the laminate preparing step) is suppressed during execution of the later process step for the removed part of hydroxyl groups and moisture. In light of the operation of the heating step, the heating step may be executed in the condition that the peripheral atmosphere of each of the glasses 1, 2 is put under reduced pressure (for example, not more than 1 kPa) or under low humidity (for example, humidity of not more than 40%) so as to further suppress the increase of adhesive force from the initial value. In this manner, hydroxyl groups and moisture can be removed more easily.

In the laminate preparing step, the glasses 1, 2 are directly laminated in the condition that the glass film 1 and the support glass 2 are heated to 100° C. or higher. Here, the temperature of the glasses 1, 2 (hereinafter, referred to as lamination temperature) at the time of laminating the glass film 1 and the support glass 2 is preferably 150° C. or higher, more preferably 200° C. or higher, most preferably 300° C. or higher. The upper limit of the lamination temperature is 400° C. The higher the lamination temperature, the more easily the glass film 1 is prevented from being peeled off from the support glass 2 during execution of the process step. The lamination temperatures of the glass film 1 and the support glass 2 may be the same or different between the glasses 1, 2.

The lamination temperature of the glass film 1 and the support glass 2 may be the same or different from the temperature of the glasses 1, 2 directly after execution of the heating step (hereinafter, referred to as preparative heating temperature). For example, when the lamination temperature of the glasses 1, 2 is the same as the preparative heating temperature, the laminate preparing step may be executed directly after execution of the heating step to laminate the glasses 1, 2. In this manner, the thermal energy obtained by the glasses 1, 2 during execution of the heating step can be used without waste at the time of execution of the laminate preparing step. When the lamination temperature of the glasses 1, 2 is the same as the preparative heating temperature, after execution of the heating step, the temperature of the glasses 1, 2 may be once lowered, followed by heating to the same temperature as the preparative heating temperature again, and then the laminate preparing step may be executed to laminate the glasses 1, 2. On the other hand, when the lamination temperature of the glasses 1, 2 is different from the preparative heating temperature, after execution of the heating step, the glasses 1, 2 may be heated to higher temperature, and then the laminate preparing step may be executed to laminate the glasses 1, 2 (when the lamination temperature is higher than the preparative heating temperature). Also, after the temperature of the glasses 1, 2 has lowered from the temperature directly after execution of the heating step, the laminate preparing step may be executed to laminate the glasses 1, 2 (when the lamination temperature is lower than the preparative heating temperature).

By execution of the laminate preparing step, the laminate 3 is prepared, and the initial value of adhesive force acting between the glasses 1, 2 increases for the heating of the glass film 1 and the support glass 2. Likewise the execution of the heating step, the laminate preparing step may be executed in the condition that the peripheral atmosphere of each of the glasses 1, 2 is put under reduced pressure (for example, less than or equal to 1 kPa) or under low humidity (for example, humidity of less than or equal to 40%). As a result, it becomes easy to prevent the hydroxyl groups and moisture removed from each of the mating faces 1a, 2a by execution of the heating step, from regenerating on the mating faces 1a, 2a. For increasing the initial value of the adhesive force, pressure may be applied to the laminate 3 in the thickness direction (applying a pressure ranging from 0.0001 MPa to 1 MPa, for example) after laminating the glass film 1 and the support glass 2.

In the process step, on a measuring area 1b of the glass film 1 in the laminate 3, an anode layer 6, a hole transport layer 7, a light-emitting layer 8, an electron transport layer 9, and a cathode layer 10 are sequentially laminated to form the organic EL device 4, and the organic EL device 4 formed on the measuring area 1b is covered with a cover glass 11. For formation of the layers 6 to 10, various deposition methods represented by the CVD method and sputtering method can be employed. At the time of executing the process step, the temperature of the laminate 3 is heated to, for example, about 300° C. The cover glass 11 is adhered to the glass film 1 by directly laminating a peripheral part 11a thereof to the glass film 1, and irradiating the part where they overlap with each other with a laser beam. As the cover glass 11, the glass having the same composition with the glass film 1 (alkalifree glass in the present embodiment) is preferably used. In this manner, it is possible to prevent the glass film 1 or the cover glass 11 from being broken during execution of the process step due to the difference in magnitude of the coefficient of thermal expansion from the glass film 1.

While the peripheral part 11a of the cover glass 11 and the glass film 1 are directly laminated in the present embodiment, the peripheral part 11a of the cover glass 11 and the glass film 1 may be laminated with a glass frit or a spacer interposed therebetween. While the organic EL device 4 is formed as an electronic device member on the measuring area 1b of the glass film 1 in the present embodiment, the present invention is not limited to this. For example, as the electronic device member, a liquid crystal device, a touch panel device, a solar cell device, a piezoelectric device, a light-receiving device, a battery device such as lithium ion secondary battery, a MEMS device, a semiconductor device or the like may be formed.

In the peeling step, the glass film 1 on which the organic EL device 4 is formed can be peeled off from the support glass 2 by means of various methods. For example, the peeling may be achieved by inserting an edgy object between the glasses 1, 2, or by adsorption with an adsorption pad or the like. On completion of the peeling step, the glass film 1 on which the organic EL device 4 is formed is obtained as the glass substrate 5.

According to the method of producing a glass substrate described above, it is possible to prevent glass film 1 from peeling from the support glass 2 during the process of forming the organic EL device 4, while allowing the glass film 1 to be peeled off from the support glass 2 after the process.

Here, the method of producing a glass substrate according to the present invention is not limited to the form described in the foregoing embodiment. For example, while the glass film 1 and the support glass 2 are directly laminated at the time of executing the laminate preparing step in the above embodiment, an intermediate layer formed of an organic film or an inorganic film may be formed on the mating face 1a of the glass film 1 or on the mating face 2a of the support glass 2, and the glasses 1, 2 may be laminated with the intermediate layer interposed therebetween. In this case, it is preferred to form the intermediate layer before execution of the heating step, and to heat the intermediate layer together with the glass film 1 or the support glass 2 during execution of the heating step. In this manner, the moisture residing on the surface of the intermediate layer is partly removed, and increase from the initial value of the adhesive force during execution of the process step can be suppressed.

In the above embodiment, the glass film 1 and the support glass 2 are heated to temperatures of 100° C. or higher during execution of the heating step, and the glasses 1, 2 are laminated in the condition that the temperatures of the glass film 1 and the support glass 2 are 100° C. or higher at the time of executing the laminate preparing step, however, the present invention is not limited to this. In the heating step, it is only required to heat so that the temperatures of the glass film 1 and the support glass 2 are higher than a temperature under the normal temperature, and the glasses 1, 2 may be heated to a temperature of less than 100° C., or one of the glasses 1, 2 may be heated to a temperature of 100° C. or higher. In the laminate preparing step, it is only required that the glass film 1 and the support glass 2 are laminated in the condition that they are heated to the temperature exceeding normal temperature, and the lamination may be conducted in the condition that the temperatures of the glasses 1, 2 are less than 100° C., or the lamination may be conducted in the condition that the temperature of either one of the glasses 1, 2 is 100° C. or higher.

EXAMPLES

As an example of the present invention, in the same form as described above in the embodiment, a process of forming an organic EL device was conducted on a glass film in a laminate, and the glass film on which the organic EL device was formed was peeled off from the support glass to produce a glass substrate. Whether peeling of the glass film from the support glass occurs during the process, and whether the peeling of the glass film from the support glass occurs after the process were verified. This verification was conducted under five different conditions (Examples 1 to 3 and Comparative Examples 1, 2).

First, practice conditions that are common to Examples 1 to 3 and Comparative Examples 1, 2 will be described.

As the glass film and the support glass, alkalifree glass (product name: OA-10G) available from Nippon Electric Glass Co., Ltd. was used. The glass film has a thickness of 100 μm, and dimensions of length×breadth of 678 mm×878 mm. On the other hand, the support glass has a thickness of 500 μm, and dimensions of length×breadth of 680 mm×880 mm.

After preparing a laminate by laminating the glass film and the support glass, a process of depositing a transparent conductive film (ITO film) by sputtering method on the glass film in the laminate was conducted. The thickness of the deposited transparent conductive film is 150 nm. The process temperature of the laminate at the time of deposition was 300° C. After deposition of the transparent conductive film on the glass film, a hole injection layer, a light-emitting layer, an electron transport layer, an electron injection layer, and a cathode electrode were sequentially laminated on the transparent conductive film by vacuum deposition to form an organic EL device.

The organic EL device formed on the glass film was covered with a cover glass. As the cover glass, alkalifree glass (product name: OA-10G) available from Nippon Electric Glass Co., Ltd. was used as well as the case with the glass film and the support glass. The cover glass has a thickness of 500 μm, and dimensions of length×breadth of 678 mm×878 mm. Then the glass film on which the organic EL device was formed was peeled off from the support glass to give a glass substrate.

Next, practice conditions that are different among Examples 1 to 3 and Comparative Examples 1, 2 will be described.

In Examples 1 to 3 and Comparative Example 2, before preparing a laminate by laminating a glass film and a support glass, these glasses were heated from a temperature under normal temperature (25° C.). In Example 1 and Example 2, the glasses were heated to 300° C., and in Example 3 and Comparative Example 2, the glasses were heated to 100° C. On the other hand, in Comparative Example 1, the glasses were not heated and kept at a temperature under normal temperature (25° C.) before preparation of a laminate. Hereinafter, these temperatures are referred to as preparative heating temperature.

In Examples 1 to 3, in preparing a laminate by laminating a glass film and a support glass, they were laminated while these glasses were heated. The temperature of the glasses at the time of lamination was 300° C. in Example 1, and the temperature of the glasses at the time of lamination was 100° C. in Example 2 and Example 3. On the other hand, in Comparative Example 1 and Comparative Example 2, the temperature of the glasses at the time of lamination was a temperature under normal temperature (25° C.) and lamination was conducted while the glasses were not brought into heated conditions. Hereinafter, these temperatures are referred to as lamination temperature.

In the following, verification results in each of Examples 1 to 3 and Comparative Examples 1, 2 will be described.

In Example 1 (preparative heating temperature: 300° C., lamination temperature: 300° C.), adhesive force between the glass film and the support glass was strong, and it was possible to prevent the glass film from peeling from the support glass during the process. Also after the process, it was possible to peel off the glass film from the support glass.

In Example 2 (preparative heating temperature: 300° C., lamination temperature: 100° C.), adhesive force between the glass film and the support glass was strong, and it was possible to prevent the glass film from peeling from the support glass during the process although it was inferior to Example 1. Also after the process, it was possible to peel off the glass film from the support glass.

In Example 3 (preparative heating temperature: 100° C., lamination temperature: 100° C.), adhesive force between the glass film and the support glass was strong, and it was possible to prevent the glass film from peeling from the support glass during the process although it was inferior to Example 1. Also after the process, it was possible to peel off the glass film from the support glass.

In Comparative Example 1 (preparative heating temperature: 25° C., lamination temperature: 25° C.), although it was possible to prevent the glass film from peeling from the support glass during the process, the adhesive force between the glass film and the support glass was excessively strong, and it was impossible to peel off the glass film from the support glass after the process.

In Comparative Example 2 (preparative heating temperature: 100° C., lamination temperature: 25° C.), although it was possible to peel off the glass film from the support glass after the process, the adhesive force between the glass film and the support glass was weak and partial peeling of the glass film from the support glass was observed during the process.

The invention claimed is:

1. A method of producing a glass substrate, comprising:
   a laminate manufacturing step of laminating directly a glass film having flexibility and a support glass that supports the glass film to manufacture a laminate;
   a process step of forming an electronic device member on the glass film in the laminate, involving heating;
   a peeling step of peeling off the glass film on which the electronic device member is formed from the support glass to obtain a glass substrate; and
   a heating step of heating the glass film and the support glass individually before executing the laminate manufacturing step,
   wherein at the time of execution of the laminate manufacturing step, the glass film and the support glass in a state of being warmed by the heating step are laminated.

2. The method of producing a glass substrate according to claim 1, wherein in the heating step, the glass film and the support glass are heated to a temperature of 100° C. or higher.

3. The method of producing a glass substrate according to claim 1, wherein in the laminate manufacturing step, the temperature of the glass film and the support glass at the time of laminating the glass film and the support glass is 100° C. or higher.

* * * * *